(12) United States Patent
Iwagami

(10) Patent No.: US 11,289,982 B2
(45) Date of Patent: Mar. 29, 2022

(54) CIRCUIT BOARD, MOTOR, CONTROLLER, AND ELECTRIC PUMP

(71) Applicant: Nidec Corporation, Kyoto (JP)

(72) Inventor: Naoki Iwagami, Kawasaki (JP)

(73) Assignee: NIDEC CORPORATION, Kyoto (JP)

( * ) Notice: Subject to any disclaimer, the term of this patent is extended or adjusted under 35 U.S.C. 154(b) by 423 days.

(21) Appl. No.: 16/479,291

(22) PCT Filed: Feb. 22, 2018

(86) PCT No.: PCT/JP2018/006557
§ 371 (c)(1),
(2) Date: Jul. 19, 2019

(87) PCT Pub. No.: WO2018/155584
PCT Pub. Date: Aug. 30, 2018

(65) Prior Publication Data
US 2019/0386546 A1  Dec. 19, 2019

(30) Foreign Application Priority Data

Feb. 24, 2017  (JP) .............................. JP2017-033855

(51) Int. Cl.
*H05K 1/11* (2006.01)
*H02K 11/27* (2016.01)
(Continued)

(52) U.S. Cl.
CPC ......... *H02K 11/27* (2016.01); *F04D 13/0693* (2013.01); *H02K 5/04* (2013.01);
(Continued)

(58) Field of Classification Search
CPC ..................... H02K 9/22; H02K 11/33; H05K 2201/10416; H05K 1/0206; H05K 1/115; H05K 1/181; H05K 7/209
(Continued)

(56) References Cited

U.S. PATENT DOCUMENTS

| 7,425,762 B2 * | 9/2008 | Hasebe ................. H01L 23/142 |
| | | 257/707 |
| 2013/0328424 A1 | 12/2013 | Goto |

(Continued)

FOREIGN PATENT DOCUMENTS

| JP | 61-059379 U | 4/1986 |
| JP | 2015-047031 A | 3/2015 |

(Continued)

OTHER PUBLICATIONS

Official Communication issued in International Patent Application No. PCT/JP2018/006557, dated May 15, 2018.

*Primary Examiner* — Sherman Ng
(74) *Attorney, Agent, or Firm* — Keating & Bennett

(57) ABSTRACT

A circuit board includes a circuit board main body including a first through hole and a second through hole, a first inlay member inserted into the first through hole, and a second inlay member inserted into the second through hole. A first end surface of the first inlay member includes a first end portion on the side of the second inlay member, a second end portion on the opposite side of the second inlay member, a first area including the first end portion, and a second area including the second end portion. A first end surface of the second inlay member includes a third end portion on the side of the first inlay member, a fourth end portion on the opposite side of the first inlay member, a third area including the third end portion, and a fourth area including the fourth end portion. The circuit board further includes a first resist provided in the second area, and a second resist provided in the fourth area.

15 Claims, 4 Drawing Sheets

(51) Int. Cl.
  *H02K 11/30*    (2016.01)
  *F04D 13/06*    (2006.01)
  *H02K 5/04*     (2006.01)
  *H02K 9/22*     (2006.01)
  *H05K 1/18*     (2006.01)
  *H05K 7/20*     (2006.01)

(52) U.S. Cl.
  CPC .............. *H02K 9/22* (2013.01); *H02K 11/30* (2016.01); *H05K 1/115* (2013.01); *H05K 1/181* (2013.01); *H05K 7/209* (2013.01); *H05K 2201/10022* (2013.01); *H05K 2201/10151* (2013.01)

(58) Field of Classification Search
  USPC ......................................................... 361/719
  See application file for complete search history.

(56) References Cited

U.S. PATENT DOCUMENTS

2016/0143126 A1    5/2016   Taneko et al.
2018/0183160 A1*   6/2018   Shiomi .................. H05K 1/181

FOREIGN PATENT DOCUMENTS

| JP | 2015-104168 A | 6/2015 |
| WO | 2013/008266 A1 | 1/2013 |
| WO | 2014/199456 A1 | 12/2014 |
| WO | 2017/014127 A1 | 1/2017 |

\* cited by examiner

CIRCUIT BOARD, MOTOR, CONTROLLER, AND ELECTRIC PUMP

CROSS REFERENCE TO RELATED APPLICATIONS

This is a U.S. national stage of PCT Application No. PCT/JP2018/006557, filed on Feb. 22, 2018, and priority under 35 U.S.C. § 119(a) and 35 U.S.C. § 365(b) is claimed from Japanese Application No. 2017-033855, filed Feb. 24, 2017; the entire contents of which are hereby incorporated herein by reference.

FIELD OF THE INVENTION

The present disclosure relates to a circuit board, a motor, a controller, and an electric pump.

BACKGROUND

Conventionally, a technique has been known in which an inlay component is press-fit into a press-fit hole of a circuit board to improve heat dissipation of a circuit structure through the inlay component and a bus bar (e.g., JP 2015-047031 A). The circuit structure disclosed in JP 2015-047031 A includes a metal inlay component, a bus bar made of a plate-like metal, and a circuit board in which a conductive path is formed in an insulating plate. The bus bar has a press-fit hole into which the inlay component is press-fit. The conductive path is connected to the inlay component.

The circuit structure of JP 2015-047031 A does not take into account a case in which a spacing between two press-fit holes of a circuit board differs from a spacing between two terminals of an electronic component mounted on the circuit board. For this reason, when the spacing between press-fit holes and the spacing between terminals are different, the electronic component may become misaligned.

SUMMARY

In view of the foregoing, example embodiments of the present disclosure provide circuit boards, motors, controllers, and electric pumps that each reduce or prevent misalignment of an electronic component mounted on a circuit board.

A circuit board according to an example embodiment of the present disclosure includes a circuit board main body including a first through hole and a second through hole, a first inlay member inserted into the first through hole, and a second inlay member inserted into the second through hole. A first end surface of the first inlay member includes a first end portion on a side of the second inlay member, a second end portion on an opposite side of the second inlay member, a first area including the first end portion, and a second area including the second end portion. A first end surface of the second inlay member includes a third end portion on a side of the first inlay member, a fourth end portion on an opposite side of the first inlay member, a third area including the third end portion, and a fourth area including the fourth end portion. The circuit board further includes a first resist provided in the second area, and a second resist provided in the fourth area.

According to example embodiments of the present disclosure, it is possible to provide circuit boards, motors, controllers, and electric pumps that each reduce or prevent misalignment of an electronic component mounted on a circuit board.

The above and other elements, features, steps, characteristics and advantages of the present disclosure will become more apparent from the following detailed description of the example embodiments with reference to the attached drawings.

DETAILED DESCRIPTION

First Example Embodiment

Figure 1A:
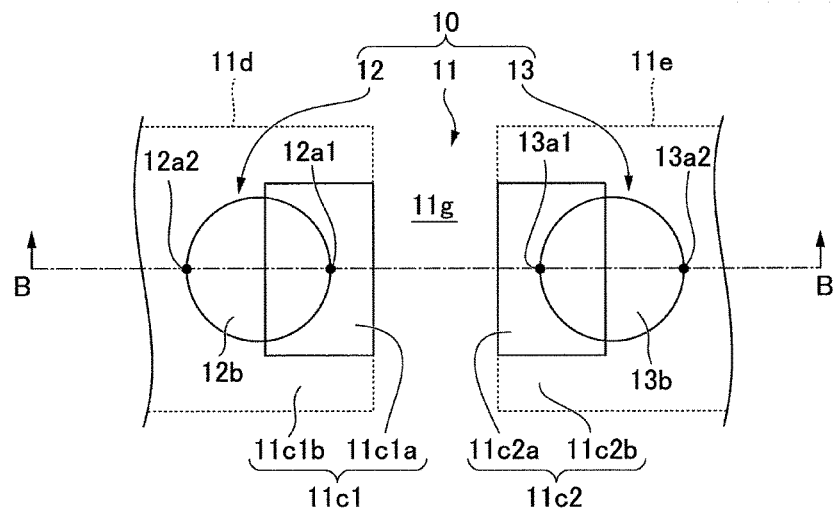
FIG. 1A is a plan view of a main portion of a circuit board of a first example embodiment of the present disclosure.
Figure 1B:
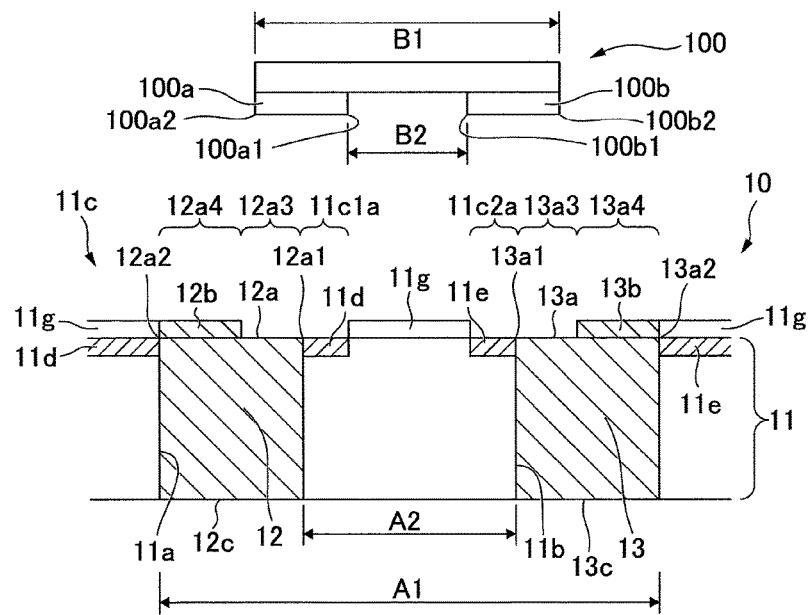
FIG. 1B is a cross-sectional view taken along line B-B of FIG. 1A.

FIG. 1A is a plan view in which a part of a circuit board 10 is enlarged, showing a first inlay member 12 and a second inlay member 13 respectively inserted into a first through hole 11a (see FIG. 1B) and a second through hole 11b (see FIG. 1B) in a circuit board main body 11, and a first conductive pattern 11d and a second conductive pattern 11e formed on a surface 11c (see FIG. 1B) of the circuit board main body 11. In addition, a first resist 12b and a second resist 13b are provided in a part of a first end face 12a (see FIG. 1B) of the first inlay member 12 and a part of a first end face 13a (see FIG. 1B) of the second inlay member 13, respectively. FIG. 1B shows a cross-sectional view taken along line B-B of FIG. 1A, and a cross-sectional view of an electronic component 100 attached to the circuit board 10. As shown in FIGS. 1A and 1B, the circuit board 10 of the first example embodiment includes the circuit board main body 11, the first inlay member 12 having a cylindrical shape, for example, and the second inlay member 13 having a cylindrical shape, for example. The circuit board main body 11 has the first through hole 11a and the second through hole 11b. The first inlay member 12 is inserted into the first through hole 11a. The second inlay member 13 is inserted into the second through hole 11b. The first inlay member 12 and the second inlay member 13 are made of a metal such as copper, for example.

In the circuit board 10 of the first example embodiment, the first inlay member 12 is fixed to the circuit board main body 11 by press-fitting the first inlay member 12 into the first through hole 11a. Similarly, the second inlay member 13 is fixed to the circuit board main body 11 by press-fitting the second inlay member 13 into the second through hole 11b.

As shown in FIGS. 1A and 1B, the first end face 12a of the first inlay member 12 has a first end portion 12a1, a second end portion 12a2, a first area 12a3, and a second area 12a4. The first end portion 12a1 is an end portion of the first end face 12a on the side close to the second inlay member 13 (right side in FIGS. 1A and 1B) with respect to the center of the first end face 12a. The second end portion 12a2 is an end portion of the first end face 12a on the opposite side (left side in FIGS. 1A and 1B) of the second inlay member 13 with respect to the center of the first end face 12a. The first area 12a3 is an area including the first end portion 12a1. The second area 12a4 is an area including the second end portion 12a2. The circuit board 10 further includes the first resist 12b. Specifically, the first resist 12b is provided in the second area 12a4 of the first inlay member 12.

The first end face 13a of the second inlay member 13 has a third end portion 13a1, a fourth end portion 13a2, a third area 13a3, and a fourth area 13a4. The third end portion 13a1 is an end portion of the first end face 13a on the side of the first inlay member 12 (left side in FIGS. 1A and 1B) with respect to the center of the first end face 13a. The fourth end portion 13a2 is an end portion of the first end face 13a on the opposite side (right side in FIGS. 1A and 1B) of the first inlay member 12 with respect to the center of the first end face 13a. The third area 13a3 is an area including the third end portion 13a1. The fourth area 13a4 is an area including the fourth end portion 13a2. The circuit board 10 further includes the second resist 13b. Specifically, the second resist 13b is provided in the fourth area 13a4 of the second inlay member 13.

Figure 2A:
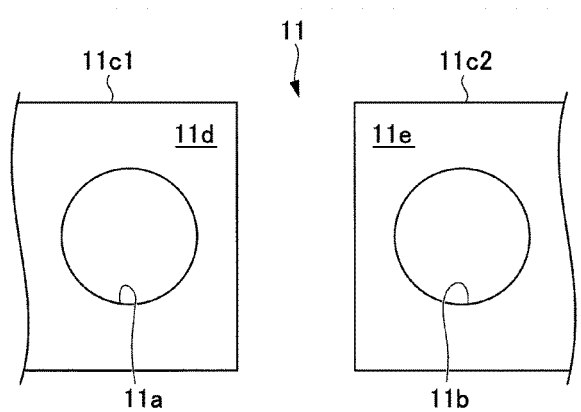
FIG. 2A is a diagram for explaining a manufacturing process of the circuit board of the first example embodiment of the present disclosure.
Figure 2B:
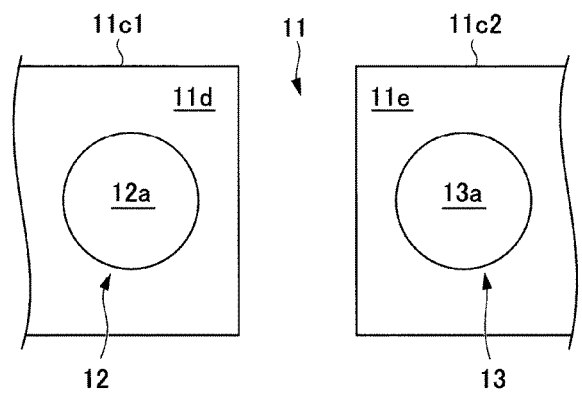
FIG. 2B is a diagram for explaining the manufacturing process of the circuit board of the first example embodiment of the present disclosure.
Figure 2C:
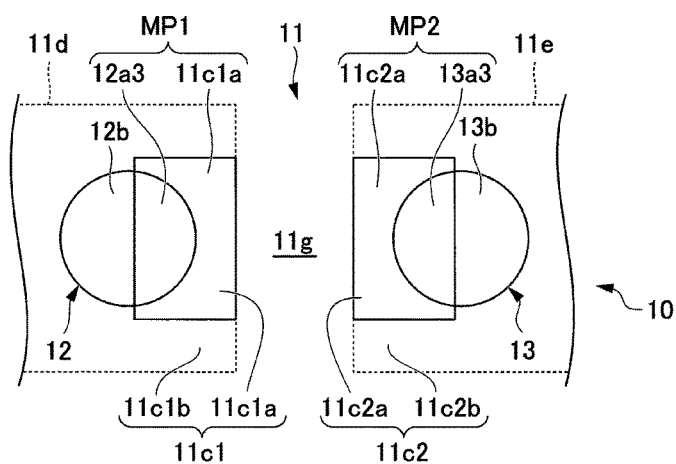
FIG. 2C is a diagram for explaining the manufacturing process of the circuit board of the first example embodiment of the present disclosure.

FIGS. 2A, 2B, and 2C are diagrams for explaining a manufacturing process of the circuit board 10 of the first example embodiment.

In the example of manufacturing the circuit board 10 of the first example embodiment shown in FIGS. 2A, 2B, and 2C, first, as shown in FIG. 2A, the first through hole 11a and the second through hole 11b are formed in the circuit board main body 11. Further, copper plating (not shown) including the first conductive pattern 11d and the second conductive pattern 11e is formed on the circuit board main body 11. Next, as shown in FIG. 2B, the first inlay member 12 is inserted into the first through hole 11a of the circuit board main body 11. Additionally, the second inlay member 13 is inserted into the second through hole 11b of the circuit board main body 11. Next, circuit forming processing is performed to form the outline of the first conductive pattern 11d and the second conductive pattern 11e as shown in FIG. 2B. Next, as shown in FIG. 2C, the first resist 12b is formed on the first end face 12a of the first inlay member 12, the second resist 13b is formed on the first end face 13a of the second inlay member 13, and a third resist 11g is formed on the circuit board main body 11. Specifically, a part of the first conductive pattern 11d is covered with the third resist 11g. As a result, a first pattern non-exposed area 11c1b is formed. A portion of the first conductive pattern 11d not covered with the third resist 11g is a first pattern exposed area 11c1a. A first mount pad MP1 is formed of the first area 12a3 of the first end face 12a of the first inlay member 12 and the first pattern exposed area 11c1a of the circuit board main body 11. In addition, a part of the second conductive pattern 11e is covered with the third resist 11g. As a result, a second pattern non-exposed area 11c2b is formed. A portion of the second conductive pattern 11e not covered with the third resist 11g is a second pattern exposed area 11c2a. A second mount pad MP2 is formed of the third area 13a3 of the first end face 13a of the second inlay member 13 and the second pattern exposed area 11c2a of the circuit board main body 11.

Specifically, in the example of the circuit board 10 of the first example embodiment shown in FIGS. 2A, 2B, and 2C, one (upper side in FIG. 1B) surface 11c of the circuit board main body 11 has a first adjacent area 11c1 adjacent to the first through hole 11a and a second adjacent area 11c2 adjacent to the second through hole 11b. The first conductive pattern 11d is formed in the first adjacent area 11c1. The first adjacent area 11c1 has the first pattern exposed area 11c1a where the first conductive pattern 11d is exposed. Moreover, the first adjacent area 11c1 has the first pattern non-exposed area 11c1b where the first conductive pattern 11d is covered with the third resist 11g. The first pattern exposed area 11c1a is disposed on the side close to the second through hole 11b (right side in FIG. 2B) with respect to the center of the first through hole 11a. The second conductive pattern 11e is formed in the second adjacent area 11c2. The second adjacent area 11c2 has the second pattern exposed area 11c2a where the second conductive pattern 11e is exposed. Moreover, the second adjacent area 11c2 has the second pattern non-exposed area 11c2b where the second conductive pattern 11e is covered with the third resist 11g. The second pattern exposed area 11c2a is disposed on the side close to the first through hole 11a (left side in FIG. 2B) with respect to the center of the second through hole 11b.

In the example shown in FIGS. 2A, 2B, and 2C, after the first inlay member 12 is inserted into the first through hole 11a and the second inlay member 13 is inserted into the second through hole 11b, the first resist 12b, the second resist 13b, and the third resist 11g are formed simultaneously. In another example, the first resist 12b, the second resist 13b, and the third resist 11g may be formed in separate processes instead. That is, in this example, after the third resist 11g is formed on the circuit board main body 11, the first inlay member 12 provided with the first resist 12b is inserted into the first through hole 11a of the circuit board main body 11, and the second inlay member 13 provided with the second resist 13b is inserted into the second through hole 11b of the circuit board main body 11.

Figure 3:
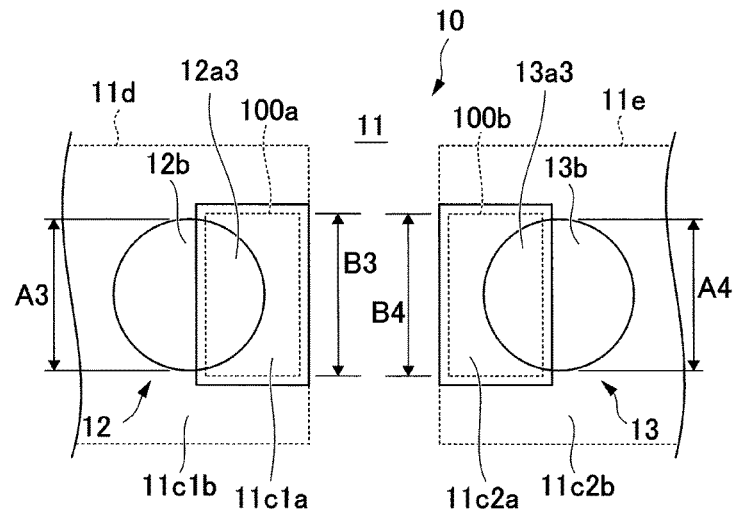
FIG. 3 is a diagram showing a relationship between a circuit board main body of the circuit board of the first example embodiment of the present disclosure and first and second terminals of an electronic component.

FIG. 3 is a diagram showing a relationship between the circuit board main body 11 of the circuit board 10 of the first example embodiment and a first terminal 100a and a second terminal 100b of the electronic component 100. In the example shown in FIGS. 1A, 1B, and 3, the circuit board 10 further includes the electronic component 100. The electronic component 100 has the first terminal 100a and the second terminal 100b. The first terminal 100a is disposed on the first mount pad MP1. The first mount pad MP1 is the first area 12a3 of the first end face 12a of the first inlay member 12 and the first pattern exposed area 11c1a of the first adjacent area 11c1 of the one surface 11c of the circuit board main body 11. The second terminal 100b is disposed on the second mount pad MP2. The second mount pad MP2 is the third area 13a3 of the first end face 13a of the second inlay member 13 and the second pattern exposed area 11c2a of the second adjacent area 11c2 of the one surface 11c of the circuit board main body 11. The first terminal 100a has an inner end portion 100a1 and an outer end portion 100a2. The inner end portion 100a1 of the first terminal 100a is an end portion of the first terminal 100a on the side (right side in FIG. 1B) of the second terminal 100b. The outer end portion 100a2 of the first terminal 100a is an end portion of the first terminal 100a on the opposite side (left side in FIG. 1B) of the second terminal 100b. The second terminal 100b has an inner end portion 100b1 and an outer end portion 100b2. The inner end portion 100b1 of the second terminal 100b is an end portion of the second terminal 100b on the side (left side in FIG. 1B) of the first terminal 100a. The outer end portion 100b2 of the second terminal 100b is an end portion of the second terminal 100b on the opposite side (right side in FIG. 1B) of the first terminal 100a. As shown in FIG. 1B, a spacing B1 between the outer end portion 100a2 of the first terminal 100a and the outer end portion 100b2 of the second terminal 100b is smaller than a spacing A1 between the second end portion 12a2 and the fourth end portion 13a2.

As described above, the circuit board 10 of the first example embodiment includes the first resist 12b and the second resist 13b. Hence, with the circuit board 10 of the first example embodiment, in a case where the electronic component 100 having the spacing B1 between the outer end portion 100a2 and the outer end portion 100b2 smaller than the spacing A1 between the second end portion 12a2 and the fourth end portion 13a2 is mounted on the circuit board 10, misalignment of the electronic component 100 can be suppressed more than when the first resist 12b and the second resist 13b are not provided.

Further, as described above, in the example of the circuit board 10 of the first example embodiment shown in FIGS. 2A, 2B, and 2C, the first pattern exposed area 11c1a is disposed on the side close to the second through hole 11b (right side in FIG. 2B) with respect to the center of the first through hole 11a. The first conductive pattern 11d is formed in the first pattern exposed area 11c1a. Further, the second pattern exposed area 11c2a is disposed on the side close to the first through hole 11a (left side in FIG. 2B) with respect to the center of the second through hole 11b. The second conductive pattern 11e is formed in the second pattern exposed area 11c2a. Accordingly, as shown in FIG. 1B, the electronic component 100 having a spacing B2 between the inner end portion 100a1 of the first terminal 100a and the inner end portion 100b1 of the second terminal 100b smaller than a spacing A2 between the first end portion 12a1 and the third end portion 13a1 can be mounted on the circuit board 10.

In the example shown in FIG. 3, a width B3 of the first terminal 100a in a direction parallel to a plane including the first end face 12a (see FIG. 1B) of the first inlay member 12 and the first end face 13a (see FIG. 1B) of the second inlay member 13 and perpendicular to a line connecting the second end portion 12a2 (see FIG. 1A) and the fourth end portion 13a2 (see FIG. 1A), is larger than a diameter A3 of the first inlay member 12. Additionally, a width B4 of the second terminal 100b in the direction parallel to the plane including the first end face 12a and the first end face 13a and perpendicular to the line connecting the second end portion 12a2 and the fourth end portion 13a2, is larger than a diameter A4 of the second inlay member 13. That is, in the example shown in FIG. 3, the diameter A3 of the first inlay member 12 and the diameter A4 of the second inlay member 13 are small. For this reason, when the first inlay member 12 and the second inlay member 13 are fixed to the circuit board main body 11, the load exerted on the circuit board main body 11 by the first inlay member 12 and the second inlay member 13 can be reduced.

That is, in the example of the circuit board 10 of the first example embodiment shown in FIGS. 1B and 3, the first terminal 100a of the electronic component 100 is disposed not only on the first end face 12a of the first inlay member 12 but also on the first conductive pattern 11d. Further, the second terminal 100b of the electronic component 100 is disposed not only on the first end face 13a of the second inlay member 13 but also on the second conductive pattern 11e. Accordingly, the electronic component 100 having the first terminal 100a larger than the first end face 12a of the first inlay member 12 and the second terminal 100b larger than the first end face 13a of the second inlay member 13 can be mounted. Further, in the circuit board 10 of the first example embodiment, since the first inlay member 12 and the second inlay member 13 can be selected in the range of the sizes of the first terminal 100a and the second terminal 100b, the size of the circuit board 10 can be reduced (the size of the circuit board 10 need not be increased for the first inlay member 12 and the second inlay member 13). That is, the small electronic component 100 having a small spacing between the first terminal 100a and the second terminal 100b can be mounted without disposing the first inlay member 12 and the second inlay member 13 close to each other. Thus, the circuit board 10 can be downsized.

In the example of the circuit board 10 of the first example embodiment shown in FIGS. 1B and 3, the first terminal 100a of the electronic component 100 is connected to the first end face 12a of the first inlay member 12 through solder, for example. Further, the second terminal 100b of the electronic component 100 is connected to the first end face 13a of the second inlay member 13 through solder, for example. Accordingly, in the example of the circuit board 10 of the first example embodiment shown in FIGS. 1B and 3, heat generated by the electronic component 100 can be passed to the first end face 12a of the first inlay member 12 and the first end face 13a of the second inlay member 13. Further, in the example of the circuit board 10 of the first example embodiment shown in FIGS. 1B and 3, the first terminal 100a of the electronic component 100 is connected to the first pattern exposed area 11c1a of the one surface 11c of the circuit board main body 11 through solder, for example. In addition, the second terminal 100b of the electronic component 100 is connected to the second pattern exposed area 11c2a of the one surface 11c of the circuit board main body 11 through solder, for example. Accordingly, in the example of the circuit board 10 of the first example embodiment shown in FIGS. 1B and 3, a current is allowed to flow from the first conductive pattern 11d of the circuit board main body 11 to the second conductive pattern 11e of the circuit board main body 11 through the electronic component 100, or from the second conductive pattern 11e of the circuit board main body 11 to the first conductive pattern 11d of the circuit board main body 11 through the electronic component 100.

In the example of the circuit board 10 of the first example embodiment shown in FIGS. 1B, 2C, and 3, the first pattern exposed area 11c1a is provided in the first mount pad MP1 and the second pattern exposed area 11c2a is provided in the second mount pad MP2. Hence, as compared to a case where the first pattern exposed area 11c1a and the second pattern exposed area 11c2a are not provided in the circuit board main body 11, a current path between the electronic component 100 mounted on the circuit board 10 and the circuit board 10 can be secured more reliably. Further, as compared to a case where the first pattern exposed area 11c1a and the second pattern exposed area 11c2a are not provided in the circuit board main body 11, the fillet of the solder connecting the circuit board 10 and the electronic component 100 can be formed in a more ideal shape. That is, the connectivity between the circuit board 10 and the electronic component 100 can be improved, and soldering defects can be reduced, for example.

Specifically, in the example of the circuit board 10 of the first example embodiment shown in FIG. 3, a part of the first terminal 100a is disposed on the first pattern exposed area 11c1a of the circuit board main body 11. Hence, as compared to a case where the first terminal 100a is not disposed on the first pattern exposed area 11c1a of the circuit board main body 11, a current path between the first terminal 100a and the circuit board main body 11 can be secured more reliably. Moreover, in the example of the circuit board 10 of the first example embodiment shown in FIG. 3, a part of the second terminal 100b is disposed on the second pattern exposed area 11c2a of the circuit board main body 11. Hence, as compared to a case where the second terminal 100b is not disposed on the second pattern exposed area 11c2a of the circuit board main body 11, a current path between the second terminal 100b and the circuit board main body 11 can be secured more reliably.

As described above, in the circuit board 10 of the first example embodiment, the first inlay member 12 is press-fit into the first through hole 11a, and the second inlay member 13 is press-fit into the second through hole 11b. That is, the first inlay member 12 and the second inlay member 13 are fixed to the circuit board main body 11 by press-fitting. Additionally, in the circuit board 10 of the first example embodiment, as shown in FIG. 1B, the spacing A2 between the first end portion 12a1 and the third end portion 13a1 is 3 mm or more. For this reason, even if the first inlay member 12 is press-fit into the first through hole 11a and the second inlay member 13 is press-fit into the second through hole 11b, deformation of the circuit board 10 at the time of press-fitting of the first inlay member 12 or the second inlay member 13 can be suppressed. That is, in the circuit board 10 of the first embodiment, the electronic component 100 having the spacing B2 between the inner end portion 100a1 and the inner end portion 100b1 smaller than the spacing A2 between the first through hole 11a and the second through hole 11b can be mounted while suppressing deformation of the circuit board 10 at the time of press-fitting.

In the example of the circuit board 10 of the first example embodiment shown in FIGS. 1B and 3, the electronic component 100 is a current sensing resistor. For example, the current sensing resistor is a shunt resistor. In another example, an electronic component other than the current sensing resistor, or an electronic component other than the shunt resistor may be mounted on the circuit board 10 as the electronic component 100. As described above, in the example shown in FIGS. 1A, 1B and 3, the cylindrical first inlay member 12 and second inlay member 13 are used. However, in other examples, a non-cylindrical first inlay member 12 and second inlay member 13 may be used.

Second Example Embodiment

A circuit board 10 of a second example embodiment is configured in a similar manner as the circuit board 10 of the first example embodiment described above, except for the points described below. Hence, the circuit board 10 of the second example embodiment can exhibit effects similar to those of the circuit board 10 of the first example embodiment described above.

Figure 4:
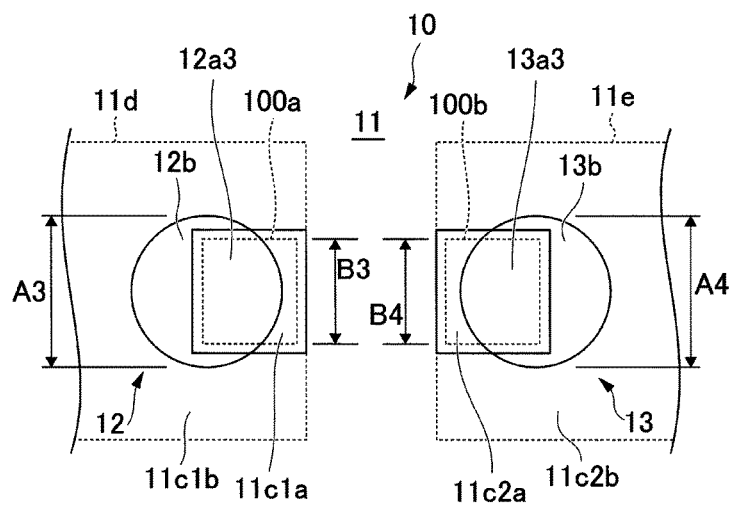
FIG. 4 is a diagram showing a relationship between a circuit board main body of a circuit board of a second example embodiment of the present disclosure and first and second terminals of an electronic component.

FIG. 4 is a diagram showing a relationship between a circuit board main body 11 of the circuit board 10 of the second example embodiment and a first terminal 100a and a second terminal 100b of an electronic component 100. In the example of the circuit board 10 of the second example embodiment shown in FIG. 4, a width B3 of the first terminal 100a in a direction parallel to a plane including a first end face 12a of a first inlay member 12 and a first end face 13a of a second inlay member 13 and perpendicular to a line connecting a second end portion 12a2 and a fourth end portion 13a2, is smaller than a diameter A3 of the first inlay member 12. Additionally, a width B4 of the second terminal 100b in the direction parallel to the plane including the first end face 12a and the first end face 13a and perpendicular to the line connecting the second end portion 12a2 and the fourth end portion 13a2, is smaller than a diameter A4 of the second inlay member 13. In the example of the circuit board 10 of the second example embodiment shown in FIG. 4, the ratio of the portion where the first terminal 100a and the first inlay member 12 overlap in the entire first terminal 100a is larger than that in the example of the circuit board 10 of the first example embodiment shown in FIG. 3. Moreover, the ratio of the portion where the second terminal 100b and the second inlay member 13 overlap in the entire second terminal 100b is larger than that in the example of the circuit board 10 of the first example embodiment shown in FIG. 3. Accordingly, in the example of the circuit board 10 of the second example embodiment shown in FIG. 4, heat dissipation from the electronic component 100 to the first inlay member 12 and the second inlay member 13 is improved compared to the example of the circuit board 10 of the first example embodiment shown in FIG. 3. As a result, an electronic component having low heat resistance (i.e., electronic component with small widths B3, B4) can be used as the electronic component 100.

Third Example Embodiment

A circuit board 10 of a third example embodiment is configured in a similar manner as the circuit board 10 of the first example embodiment described above, except for the points described below. Hence, the circuit board 10 of the third example embodiment can exhibit effects similar to those of the circuit board 10 of the first example embodiment described above.

In the circuit board 10 of the third example embodiment, a first inlay member 12 is fixed to a circuit board main body 11, by caulking a first end face (upper end face in FIG. 1B) 12a and a second end face (lower end face in FIG. 1B) of the first inlay member 12 inserted into a first through hole 11a. Similarly, a second inlay member 13 is fixed to the circuit board main body 11, by caulking a first end face (upper end face in FIG. 1B) 13a and a second end face (lower end face in FIG. 1B) of the second inlay member 13 inserted into a second through hole 11b. That is, in the circuit board 10 of the third example embodiment, the first inlay member 12 and the second inlay member 13 are not press-fit into the circuit board main body 11. Hence, the burden on the circuit board main body 11 can be reduced.

First Application Example

Figure 5:
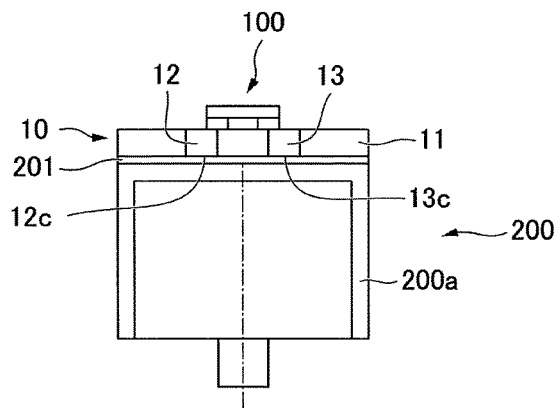
FIG. 5 is a diagram showing a motor to which a circuit board of any of the first to third example embodiments of the present disclosure is applied.

In an example shown in FIG. 5, the circuit board 10 of any of the first to third example embodiments is applied to a motor 200, and functions as a control circuit board for driving the motor 200. That is, in the example shown in FIG. 5, the motor 200 includes the circuit board 10 and a motor housing 200a formed of aluminum having a high thermal conductivity, for example. The circuit board 10 is connected to the motor housing 200a through an electrical insulating member 201. That is, a second end face 12c of a first inlay member 12 and a second end face 13c of a second inlay member 13 are connected to the motor housing 200a through the electrical insulating member 201. Accordingly, a part of heat generated by an electronic component 100 is transferred to the motor housing 200a through the first inlay member 12 and the electrical insulating member 201. Further, another part of the heat generated by the electronic component 100 is transferred to the motor housing 200a through the second inlay member 13 and the electrical insulating member 201. The heat transferred to the motor housing 200a is dissipated from the motor housing 200a. As a result, heat dissipation of the electronic component 100 is improved, the amount of current flowing to the electronic component 100 can be increased, and high speed rotation or high torque of the motor 200 can be achieved. Furthermore, an electronic component 100 with high heat resistance need not be adopted, and a high-spec motor 200 can be realized with an inexpensive electronic component 100.

In the example shown in FIG. 5, the electronic component 100 is a resistor used for overcurrent detection, current control, current management, and the like. Specifically, the electronic component 100 is a shunt resistor that detects the value of a current flowing through a field effect transistor forming an inverter and a motor. The shunt resistor generates heat due to the large current flowing through the shunt resistor. The heat generated by the shunt resistor is transferred to the motor housing 200a through the first inlay member 12 and the second inlay member 13, and is dissipated from the motor housing 200a. Hence, the motor 200 to which the circuit board 10 of any of the first to third example embodiments is applied can improve heat dissipation of the shunt resistor.

Second Application Example

Figure 6:
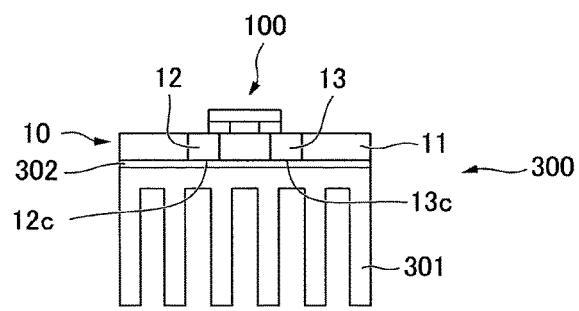
FIG. 6 is a diagram showing a controller to which the circuit board of any of the first to third example embodiments of the present disclosure is applied.

In an example shown in FIG. 6, the circuit board 10 of any of the first to third example embodiments is applied to a controller 300. That is, in the example shown in FIG. 6, the controller 300 includes the circuit board 10 and a heat sink 301. The circuit board 10 is connected to the heat sink 301 through an electrical insulating member 302. That is, a second end face 12c of a first inlay member 12 and a second end face 13c of a second inlay member 13 are connected to the heat sink 301 through the electrical insulating member 302. Accordingly, a part of heat generated by an electronic component 100 is transferred to the heat sink 301 through the first inlay member 12 and the electrical insulating member 302. Further, another part of the heat generated by the electronic component 100 is transferred to the heat sink 301 through the second inlay member 13 and the electrical insulating member 302. The heat transferred to the heat sink 301 is dissipated from a fin portion or the like of the heat sink 301. As a result, heat dissipation of the electronic component 100 is improved, and the amount of current flowing to the electronic component 100 can be increased.

Third Application Example

Figure 7:
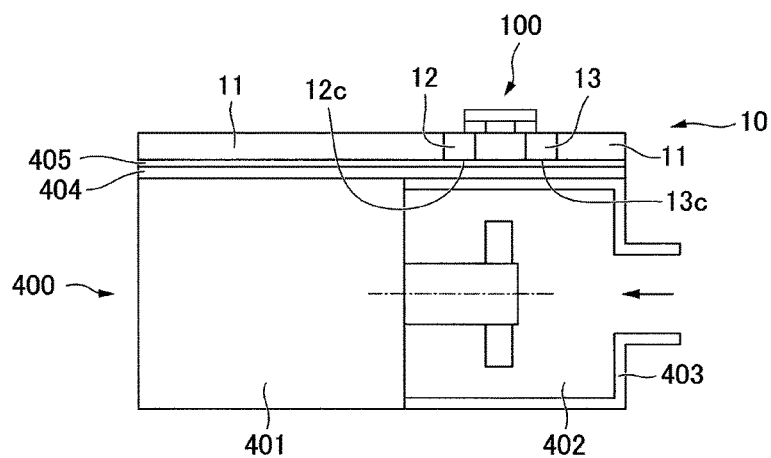
FIG. 7 is a diagram showing an electric pump to which the circuit board of any of the first to third example embodiments of the present disclosure is applied.

In an example shown in FIG. 7, the circuit board 10 of any of the first to third example embodiments is applied to an electric pump 400, and functions as a control circuit board for driving an electric pump motor 401. That is, in the example shown in FIG. 7, the electric pump 400 includes the circuit board 10, the electric pump motor 401, and a housing 403 having a flow path 402. The circuit board 10 is connected to the housing 403 through an electrical insulating member 405 and a heat sink 404. That is, a second end face 12c of a first inlay member 12 and a second end face 13c of a second inlay member 13 are connected to the housing 403 through the electrical insulating member 405 and the heat sink 404. Accordingly, a part of heat generated by an electronic component 100 is transferred to the housing 403 through the first inlay member 12, the electrical insulating member 405, and the heat sink 404. Further, another part of the heat generated by the electronic component 100 is transferred to the housing 403 through the second inlay member 13, the electrical insulating member 405, and the heat sink 404. The housing 403 is cooled by water or oil in the flow path 402. As a result, heat dissipation of the electronic component 100 is improved, the amount of current flowing to the electronic component 100 can be increased, high speed rotation or high torque of the electric pump motor 401 can be achieved, and high power of the electric pump 400 can be achieved. Furthermore, an electronic component with high heat resistance need not be adopted, and a high-spec electric pump 400 can be realized with an inexpensive electronic component 100. While the heat sink 404 is provided in the example shown in FIG. 7, in another example, the housing 403 may be formed of aluminum, for example, and the heat sink 404 may be omitted.

While example embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

The invention claimed is:

1. A circuit board comprising: a circuit board main body including a first through hole and a second through hole; a first inlay member inserted into the first through hole; and a second inlay member inserted into the second through hole; wherein a first end surface of the first inlay member includes: a first end portion on a side of the second inlay member; a second end portion on an opposite side of the second inlay member; a first area including the first end portion; and a second area including the second end portion; a first end surface of the second inlay member includes: a third end portion on a side of the first inlay member; a fourth end portion on an opposite side of the first inlay member; a third area including the third end portion; and a fourth area including the fourth end portion; and the circuit board further includes: a first resist provided in the second area; and a second resist provided in the fourth area, wherein one surface of the circuit board main body includes: a first adjacent area adjacent to the first through hole; and a second adjacent area adjacent to the second through hole; a first conductive pattern is located in the first adjacent area; a second conductive pattern is located in the second adjacent area; the first adjacent area includes: a first pattern exposed area where the first conductive pattern is exposed; and a first pattern non-exposed area where the first conductive pattern is covered with a third resist; the second adjacent area includes: a second pattern exposed area where the second conductive pattern is exposed; and a second pattern non-exposed area where the second conductive pattern is covered with the third resist; the first pattern exposed area is disposed on a side close to the second through hole with respect to a center of the first through hole; and the second pattern exposed area is disposed on a side close to the first through hole with respect to a center of the second through hole.

2. The circuit board according to claim 1, further comprising an electronic component that includes a first terminal disposed on a first mount pad which is the first area and the first pattern exposed area, and a second terminal disposed on a second mount pad which is the third area and the second pattern exposed area; wherein the first terminal includes an inner end portion and an outer end portion; the inner end portion of the first terminal is an end portion of the first terminal on a side of the second terminal; the outer end portion of the first terminal is an end portion of the first terminal on an opposite side of the second terminal; the second terminal includes an inner end portion and an outer end portion; the inner end portion of the second terminal is an end portion of the second terminal on a side of the first terminal; the outer end portion of the second terminal is an end portion of the second terminal on an opposite side of the first terminal; and a spacing between the outer end portion of the first terminal and the outer end portion of the second terminal is smaller than a spacing between the second end portion and the fourth end portion.

3. The circuit board according to claim 2, wherein the first inlay member and the second inlay member have a cylindrical shape; a width of the first terminal in a direction parallel to a plane including the first end surface of the first inlay member and the first end surface of the second inlay member and perpendicular to a line connecting the second end portion and the fourth end portion is larger than a diameter of the first inlay member; and a width of the second terminal in the direction parallel to the plane and perpendicular to the line is larger than a diameter of the second inlay member.

4. The circuit board according to claim 2, wherein the first inlay member and the second inlay member have a cylindrical shape; a width of the first terminal in a direction parallel to a plane including the first end surface of the first inlay member and the first end surface of the second inlay member and perpendicular to a line connecting the second end portion and the fourth end portion is smaller than a diameter of the first inlay member; and a width of the second terminal in the direction parallel to the plane and perpendicular to the line is smaller than a diameter of the second inlay member.

5. The circuit board according to claim 2, wherein the electronic component includes a current sensing resistor.

6. The circuit board according to claim 5, wherein the current sensing resistor includes a shunt resistor.

7. The circuit board according to claim 1, wherein a spacing between the first end portion and the third end portion is about 3 mm or more.

8. The circuit board according to claim 1, wherein the first inlay member is press-fit into the first through hole; and the second inlay member is press-fit into the second through hole.

9. A motor comprising: the circuit board according to claim 1; and a motor housing; wherein a second end surface of the first inlay member and a second end surface of the second inlay member are connected to the motor housing.

10. A controller comprising: the circuit board according to claim 1; and a heat sink; wherein a second end surface of the first inlay member and a second end surface of the second inlay member are connected to the heat sink.

11. An electric pump comprising: the circuit board according to claim 1; an electric pump motor; and a housing including a flow path; wherein a second end surface of the first inlay member and a second end surface of the second inlay member are connected to the housing.

12. The circuit board according to claim 3, wherein the electronic component includes a current sensing resistor.

13. The circuit board according to claim 4, wherein the electronic component includes a current sensing resistor.

14. The circuit board according to claim 12, wherein the current sensing resistor includes a shunt resistor.

15. The circuit board according to claim 13, wherein the current sensing resistor includes a shunt resistor.

* * * * *